(12) United States Patent
Bock (10) Patent No.: US 11,363,723 B2
(45) Date of Patent: Jun. 14, 2022

(54) PRINTED CIRCUIT BOARD AND METHOD FOR PRODUCING A PRINTED CIRCUIT BOARD

(71) Applicant: VITESCO TECHNOLOGIES GERMANY GMBH, Hannover (DE)

(72) Inventor: Johannes Bock, Munich (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 16/964,288

(22) PCT Filed: Jan. 18, 2019

(86) PCT No.: PCT/EP2019/051290
§ 371 (c)(1),
(2) Date: Jul. 23, 2020

(87) PCT Pub. No.: WO2019/145236
PCT Pub. Date: Aug. 1, 2019

(65) Prior Publication Data
US 2020/0352033 A1  Nov. 5, 2020

(30) Foreign Application Priority Data

Jan. 23, 2018  (DE) .......................... 102018201028

(51) Int. Cl.
*H05K 3/28* (2006.01)
*H05K 1/02* (2006.01)
(Continued)

(52) U.S. Cl.
CPC ............. *H05K 3/28* (2013.01); *H05K 1/0296* (2013.01); *H05K 3/4644* (2013.01);
(Continued)

(58) Field of Classification Search
CPC ...... H05K 3/28; H05K 3/4644; H05K 3/0044; H05K 1/0296; H05K 5/0034;
(Continued)

(56) References Cited

U.S. PATENT DOCUMENTS 5,744,084 A    4/1998  Chia et al.
5,801,438 A *  9/1998  Shirakawa ............. H01L 23/13
                                                       257/678
(Continued)

FOREIGN PATENT DOCUMENTS

CN     105323946 A  *  2/2016
DE        19935441 A1    3/2001
WO     2016058885 A1    4/2016

OTHER PUBLICATIONS

Machine translation of Su (CN105323946A) provided with Office Action (dated 2016).*

*Primary Examiner* — Roshn K Varghese
(74) *Attorney, Agent, or Firm* — Laurence A. Greenberg; Werner H. Stemer; Ralph E. Locher (57) ABSTRACT

A printed circuit board for an electric component contains an electrically insulating substrate which has a surface and at least one electrically conductive conductor track formed within the substrate. The surface of the substrate has a sealing region which is arranged and/or configured such that the sealing region is flat and/or the substrate has a homogenous substrate thickness in the sealing region. An overmolding which adjoins the sealing region is arranged on the surface of the substrate.

13 Claims, 5 Drawing Sheets

(51) Int. Cl.
*H05K 3/46* (2006.01)
*H05K 3/00* (2006.01)

(52) U.S. Cl.
CPC . *H05K 3/0044* (2013.01); *H05K 2201/09036* (2013.01); *H05K 2203/0228* (2013.01); *H05K 2203/1327* (2013.01)

(58) Field of Classification Search
CPC . H05K 2201/09036; H05K 2203/1327; H05K 2203/0228; H05K 2203/1147; H05K 2203/0165; H05K 2203/1316; H05K 3/284; H05K 3/0055; H01L 23/3121; H01L 23/317; H01L 23/3178; B29C 45/14418
See application file for complete search history.

(56) References Cited

U.S. PATENT DOCUMENTS

| | | | |
|---|---|---|---|
| 5,927,505 A | | 7/1999 | Chia et al. |
| 5,945,130 A | * | 8/1999 | Saxelby, Jr. .......... H01L 21/565 425/112 |
| 6,166,431 A | * | 12/2000 | Ohmori .............. H01L 23/3121 257/678 |
| 9,087,826 B2 | | 7/2015 | Noda |
| 2011/0304059 A1 | * | 12/2011 | Kobayashi ........... H05K 3/3436 257/778 |
| 2012/0000699 A1 | * | 1/2012 | Inoue ................. H01L 23/3121 174/257 |
| 2014/0362535 A1 | * | 12/2014 | Meier ................ H01L 23/4985 361/707 |
| 2017/0094796 A1 | | 3/2017 | Lor et al. |

\* cited by examiner

PRINTED CIRCUIT BOARD AND METHOD FOR PRODUCING A PRINTED CIRCUIT BOARD

BACKGROUND OF THE INVENTION

Field of the Invention

The invention relates to a printed circuit board that is overmolded, at least in certain regions, and to a method for producing it.

Printed circuit boards are known in principle. It is similarly known that, to provide protection from external media, such as for example oils and/or lubricants, printed circuit boards can be protected by overmolding. With the known printed circuit boards, it is problematic that the printed circuit board generally comprises a laminate of resin-impregnated glass fibers or glass fiber mats. Owing to differences in the glass fibers and on account of different formations of the conductor tracks arranged within the laminate, the circuit boards may have an inhomogeneous thickness. The local differences in the thickness of the printed circuit board can lead to problems when overmolding the printed circuit boards. The tool halves of the overmolding tool, also known as an overmold tool, are generally moved onto and pushed away from the printed circuit board in a displacement-controlled and/or force-controlled manner.

In the case of displacement control, the tool half stops as soon as it encounters a resistance. When there is an inhomogeneous thickness of the printed circuit board, this can have the effect that the tool half only lies against the printed circuit board in some parts and in other regions does not lie against it. When overmolding the printed circuit board with a molding compound, the compound may escape in the regions where the tool half does not lie completely on the printed circuit board. This has the effect that the printed circuit board production installation is contaminated and has to be laboriously cleaned. This can lead to a temporary unscheduled downtime of the production installations, as a result of which the production costs of the printed circuit boards are increased.

In the case of force control, the tool halves are pressed onto the printed circuit board with a predefined contact pressure. When there is an inhomogeneous thickness of the printed circuit board, this has the effect that the printed circuit board is exposed to increased pressures at the points where the printed circuit board is somewhat thicker, and thus comes into contact with the tool half first, and consequently the conductor tracks and/or plated-through holes under the printed circuit board can be damaged. A defective printed circuit board ultimately leads to the rejection of the printed circuit board and/or an entire control unit.

SUMMARY OF THE INVENTION

The object of the invention is to provide a printed circuit board and a method for producing it with which damage to the printed circuit board during the overmolding process can be reduced.

This object is achieved by the independent patent claims. Preferred developments of the invention are specified in the subclaims, the description and the drawings, which can each represent an aspect of the invention individually or in combination.

According to the invention, a printed circuit board for an electrical component is provided, comprising an electrically insulating substrate having a surface, with at least one electrically conducting conductor track formed within the substrate, the surface of the substrate having a sealing region, which is arranged and/or formed such that the sealing region is made flat and/or the printed circuit board has a homogeneous printed circuit board thickness in the sealing region, and arranged on the surface of the substrate is an overmolding, which is adjacent to the sealing region.

In other words, one aspect of the present invention is to provide a printed circuit board for an electrical component which comprises an electrically insulating substrate. The printed circuit board is preferably used in a transmission control, but it is not restricted to this. The substrate of the printed circuit board is preferably produced from a mixture of resin and glass fibers. At least one electrically conducting conductor track is formed within the substrate. The electrically conducting conductor track is preferably formed from a copper foil. Generally, multiple conductor tracks arranged spaced apart from one another are arranged within the substrate. The multiple electrically conducting conductor tracks are generally arranged spaced apart from one another by a prepreg (preimpregnated fibers), the prepreg being formed from resin and glass fibers. The substrate may have an inhomogeneous substrate thickness on account of differences in the glass fibers and/or the differences in the pattern of the electrically conducting conductor tracks.

The substrate comprises a surface, the surface of the substrate having a sealing region. The sealing region is arranged and/or formed such that it is made flat and/or the substrate has a homogeneous substrate thickness in the sealing region. Made "flat" means that the sealing region has a region that is formed parallel to the plane of the substrate. A "homogeneous substrate thickness" means that the substrate in the sealing region comprises a uniform thickness in a direction perpendicular to the plane of the substrate. In this way, in the case of a flat form of the sealing region and in the case of a homogeneous substrate thickness, an overmold tool can engage in the sealing region and finish completely flush with it. The flush finish can avoid molding compound escaping from the sealing region during overmolding. This can reduce the risk of the production installation being contaminated by molding compound escaping through the sealing region and having to be laboriously cleaned. In this way, the downtimes of the production installation can be reduced, which in turn can reduce the production costs.

The flush finish also allows local stresses to be reduced when the tool halves are moved onto the substrate in a force-controlled manner, so that damage to the conductor track arranged within the substrate during the overmolding and/or when moving the tool halves onto the substrate can be reduced. The rejection of damaged printed circuit boards can thus be reduced, which can likewise reduce the production costs of the printed circuit boards.

A preferred development of the invention is that the sealing region is formed as a groove, a channel and/or a rebate. If the sealing region is formed as a groove and/or a channel, the sealing region can preferably be formed centrally on a printed circuit board. This means that the printed circuit board can also be only partially overmolded. If the sealing region is formed as a rebate, it is preferably arranged in the edge area of the substrate. In this way, the overmolding can take place up to the edge region of the printed circuit board, so that the printed circuit board can preferably be overmolded completely. In this way, depending on the requirement, the sealing region can be formed appropriately for overmolding the printed circuit board.

The sealing region is preferably formed by a material-removing process, in particular a machining process. A preferred development of the invention is that the sealing region is milled into the substrate. The milling in of the sealing region may preferably be performed by a CNC milling machine (Computerized Numerical Control milling machine). A Z-axis oriented deep milling machine has proven to be particularly advantageous, since it has very small tolerances. A Z-axis oriented deep milling machine is also known as a ZAR milling machine (Z-axis router milling machine). In this way, the sealing region can be milled into and/or formed in the substrate by machine, inexpensively and with very high accuracy.

The depth of the sealing region in a direction perpendicular to the plane of the substrate depends, among other things, on the inhomogeneity of the printed circuit board or the substrate. A preferred development of the invention is that the sealing region has in a direction perpendicular to the plane of the substrate a depth of between 10 µm and 500 µm, preferably between 25 µm and 400 µm, and most particularly preferably between 50 µm and 250 µm. The greater the depth of the sealing region, the less the covering of the respective outer electrically conducting conductor track within the substrate. It is therefore desirable not to make the depth of the sealing region unnecessarily deep. With a depth of the sealing region of between 50 µm and 250 µm, it has been found that the tolerances of the substrate can be compensated in this way and that there is a sufficiently great covering of the respective outer electrically conducting conductor tracks within the substrate.

A preferred development of the invention is that the sealing region is formed as running around the periphery. A sealing edge of the overmold tool can thus engage in the peripheral sealing region and finish with it in a media-tight manner. In this way it can be avoided that molding compound, which may usually be a thermoplastic, escapes from the sealing region during overmolding of the surface of the substrate.

In a preferred development of the invention it is provided that, at least in some portions, the sealing region has an undercut. The undercut is formed in a direction parallel to the plane of the substrate. Accordingly, the sealing region may be formed in an L-shaped and/or T-shaped cross section. In this way, the sealing region can engage with a sealing edge of an overmold tool placed onto the substrate. In this way, the risk of overmolding compound escaping from the sealed region during the overmolding process can be reduced. A preferred development of the invention is that the surface of the substrate is an upper side and/or an underside, formed at a distance from the upper side, of the substrate. Accordingly, only the upper side of the substrate or only the underside may be overmolded. It is similarly conceivable that both the upper side and the underside are overmolded.

The invention also relates to a method for producing the printed circuit board according to the invention, comprising the steps of:
  providing a substrate, with an electrically conductive conductor track arranged and formed within the substrate;
  forming the sealing region on the surface of the substrate;
  placing an overmold tool onto the surface of the substrate, a sealing edge of the overmold tool finishing with the sealing region;
  overmolding the surface arranged between the overmold tool and the substrate.

Consequently, one aspect of the method according to the invention is that a sealing region is formed on the surface of the substrate and that a sealing edge of an overmold tool engages in the sealing region and finishes with it. The surface of the substrate arranged between the overmold tool and the substrate is then overmolded. The overmolding is preferably performed with a molding compound, which is particularly preferably a thermoplastic.

Due to the formation of the sealing region, it is made flat and/or the substrate has a homogeneous substrate thickness in the sealing region. In this way, an inhomogeneity of the substrate in the sealing region can be compensated, and thus reduced, by the formation of the sealing region. The sealing edge of the overmold tool can consequently move into the sealing region and finish flush. Damage to the conductor tracks arranged within the substrate due to an inhomogeneity of the printed circuit board can be reduced, since the sealing edge is pressed evenly over the sealing region. Damage to the printed circuit board due to the overmolding process or the moving of the tool halves onto the substrate can be reduced in this way.

In a preferred development of the invention it is provided that the sealing region is formed in the substrate with a Z-axis controlled deep milling machine. Such milling machines have a low tolerance, so that the sealing region can be introduced precisely into the substrate.

Further features and advantages of the present invention will emerge from the subclaims and the following exemplary embodiments. The exemplary embodiments are not to be understood as restrictive, but rather as given by way of example. They are intended to enable a person skilled in the art to carry out the invention. The applicant reserves the right to make one or more of the features disclosed in the exemplary embodiments the subject of patent claims or to include such features in existing patent claims.

DETAILED DESCRIPTION OF THE INVENTION

Figure 1:
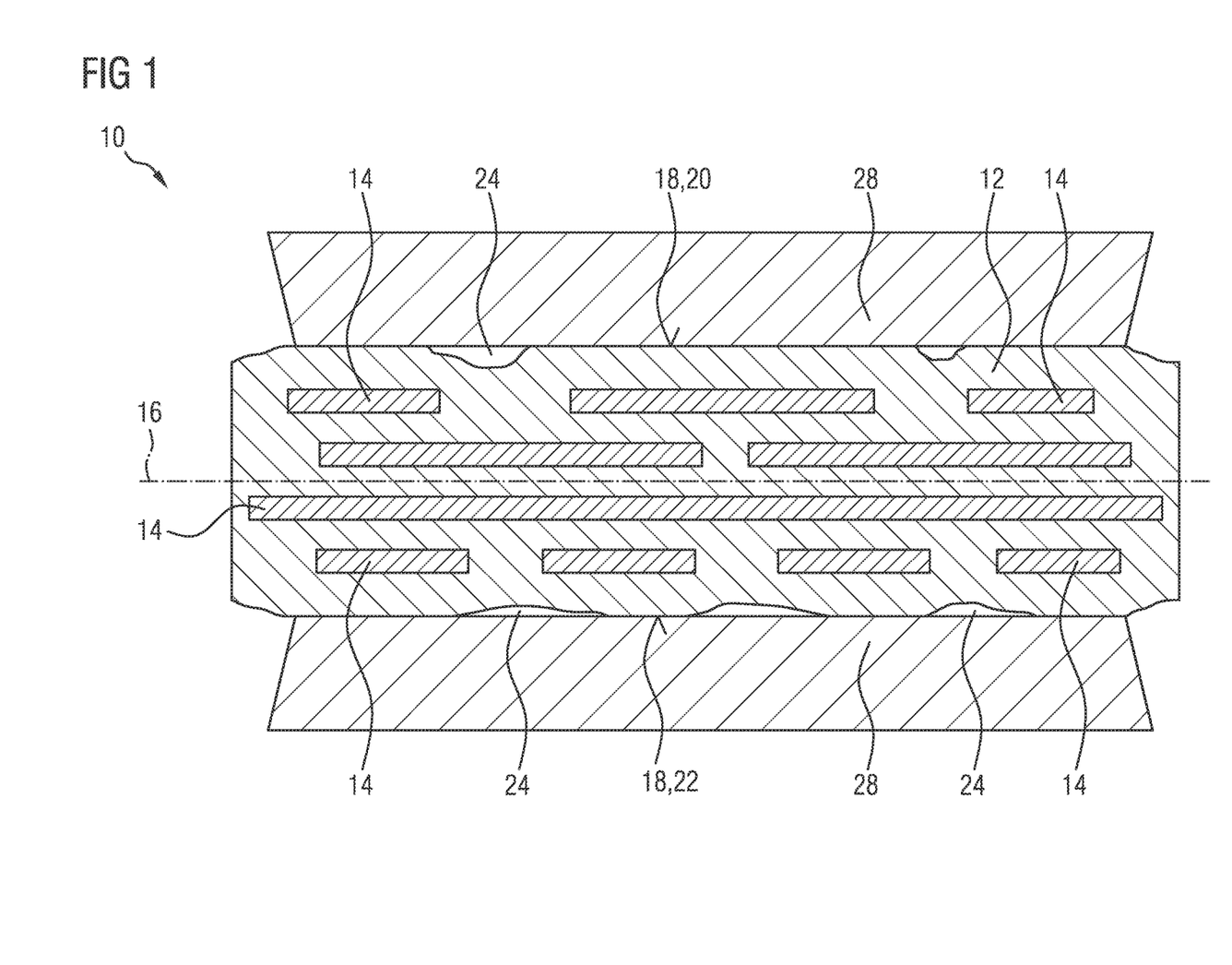
FIG. 1 shows a printed circuit board with a substrate, the substrate having an inhomogeneous surface.

In FIG. 1, a printed circuit board 10 is shown in a cross section. The printed circuit board 10 comprises an electrically insulating substrate 12. The substrate 12 comprises a laminate. The laminate has a base material which comprises a mixture of resin-impregnated glass fibers or resin-impregnated glass fiber mats. A plurality of electrically conducting conductor tracks 14 are arranged within the substrate 12, arranged one above the other in a direction perpendicular to the plane 16 of the substrate 12. The conductor tracks 14 are formed from copper and each have a different conductor track pattern.

A prepreg having the base material or the resin-impregnated glass fiber mats is formed between the respective electrically conducting conductor tracks 14. The substrate 12 has a surface 18 parallel to the plane 16. The surface 18 comprises an upper side 20 and an underside 22 that is formed at a distance from the upper side 20. On account of irregularities in the base material of the substrate, in particular the resin and glass fiber mixture, and in particular on account of the different conductor track patterns, the upper side 20 and the underside 22 have local recesses 24, so that the printed circuit board 10 or the substrate 12 has an inhomogeneous thickness.

Figure 2:
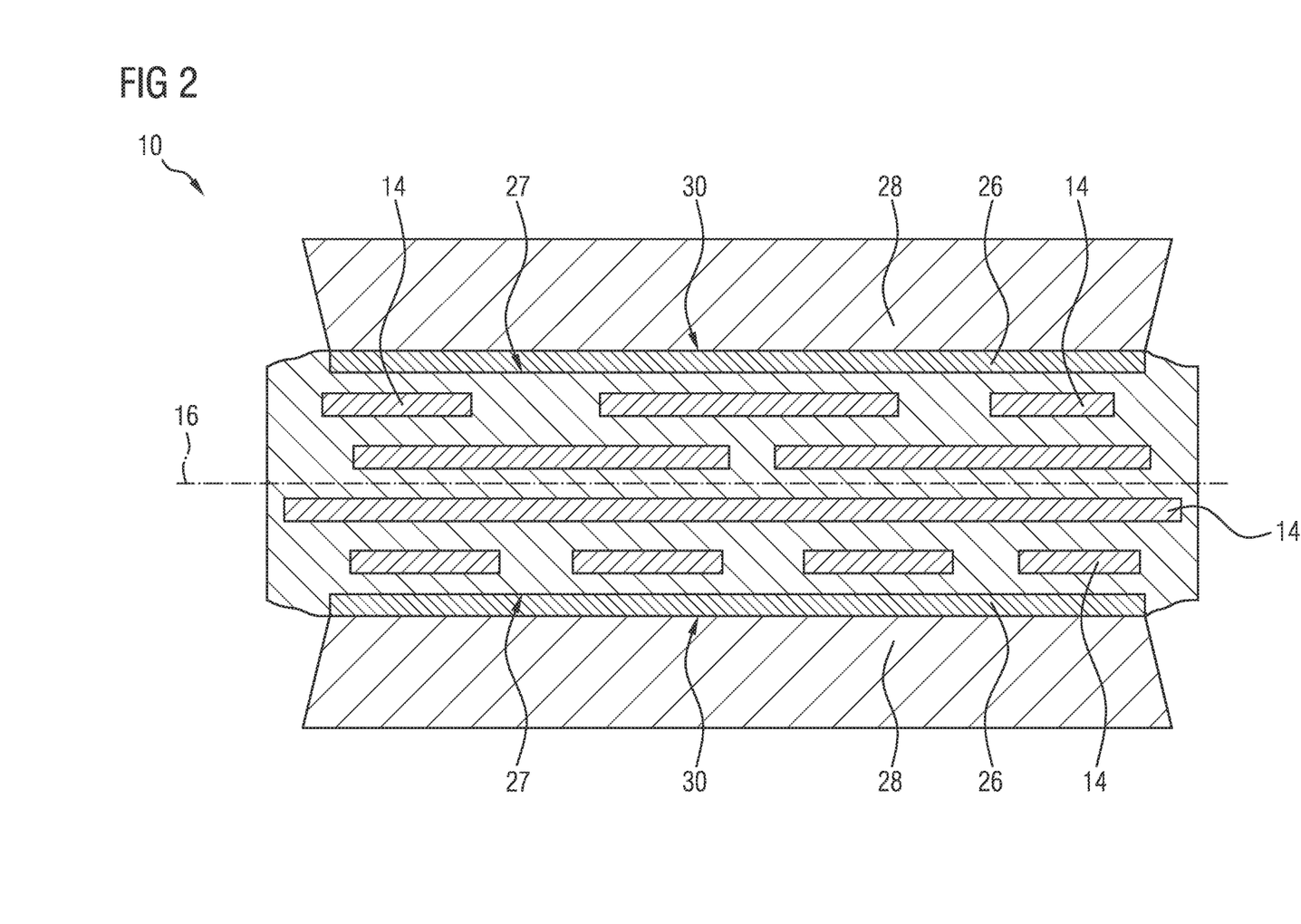
FIG. 2 shows the printed circuit board, a sealing region being formed on the surface of the substrate and an overmold tool being brought up to the substrate.

FIG. 2 shows the printed circuit board 10 known from FIG. 1, a sealing region 26 being formed in the surface 18 of the substrate 12. The sealing region 26 is formed in the present exemplary embodiment as a peripheral groove. The sealing region 26 is in this case formed such that it is made flat. This means that a groove base 27 of the groove is formed essentially parallel to the plane 16 of the substrate 12. It is also evident that the substrate 12 has a homogeneous substrate thickness in the sealing region. This means that, in the sealing region 26, the substrate 12 comprises a uniform thickness in a direction perpendicular to the plane 16 of the substrate 12.

An overmold tool 28 is respectively brought up to the upper side 20 and the underside 22 to overmold the printed circuit board 10 with a molding compound. In the present exemplary embodiment, the molding compound is a thermoplastic.

Figure 3:
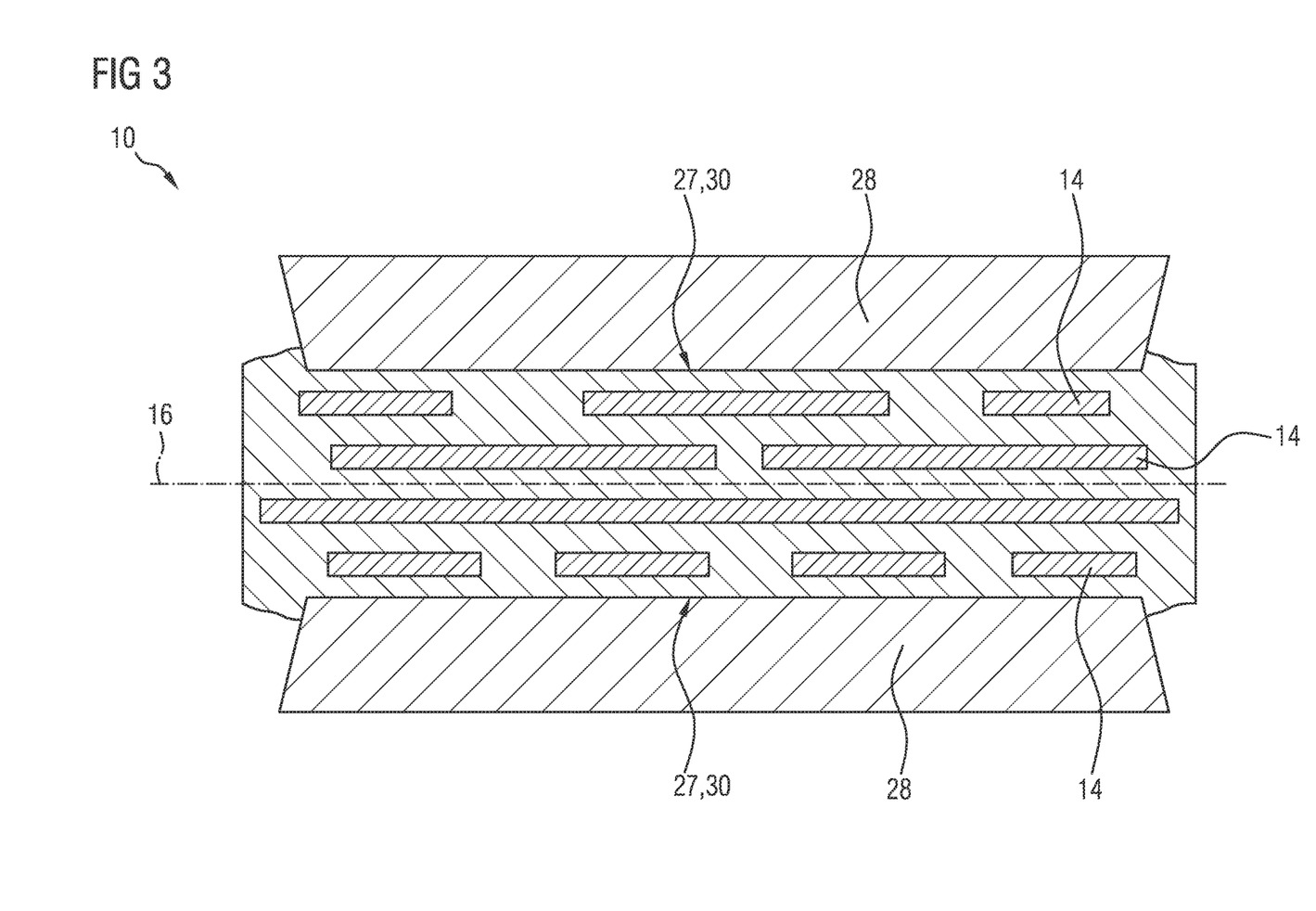
FIG. 3 shows the printed circuit board, a sealing edge of the overmold tool being made to enter the sealing region of the substrate, according to the preferred exemplary embodiment of the invention.

FIG. 3 shows the printed circuit board 10 known from FIG. 2, the overmold tool 28 being moved onto the substrate 12 to form an overmolding. In this case, a sealing edge 30 of the overmold tool 28 engages in the sealing region 26 and seals it. On account of the evenly formed sealing region 26 or the homogeneous substrate thickness in the sealing region 26, the sealing edge 30 of the overmold tool 28 lies flat on the groove base 27. Thus, when the overmold tool moves onto the substrate in a displacement-controlled manner, the sealing edge 30 can seal the sealing region 26, so that no molding compound can escape via the sealing region 26. When the overmold tool 28 moves onto the substrate 12 in a force-controlled manner, the pressure of the sealing edge 30 can be transmitted to the sealing region 26 over the entire surface area. Local stresses caused by an inhomogeneity of the substrate in the sealing region 26 when the overmold tool is moved into place are reduced, as a result of which damage to the conductor tracks 14 embedded in the substrate can be reduced.

Once the overmold tool 28 has been moved onto the substrate 12 and the sealing edge 30 of the overmold tool 28 engages in the sealing region 26 and seals it, the intermediate space between the overmold tool 28 and the surface 18 is overmolded or sealed with the molding compound.

Figure 4:
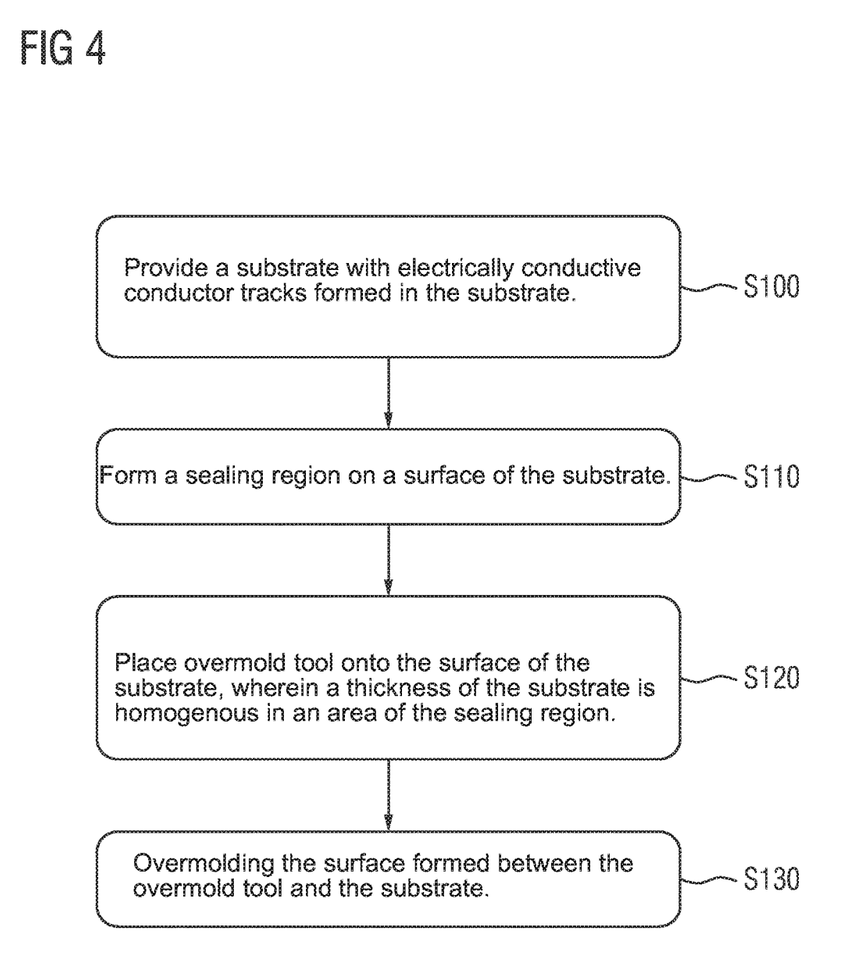
FIG. 4 shows a method for producing the printed circuit board.

FIG. 4 shows a method for producing the printed circuit board 10. The method comprises in a first step 100 providing the substrate 12, with the electrically conductive conductor tracks 14 arranged and formed within the substrate 12.

In a second step 110, the sealing region 26 is formed on the surface 18 of the substrate 12. The sealing region 26 can be formed by various types of material-removing processes. In the present exemplary embodiment, the sealing region is formed in the substrate 12 by means of a Z-axis controlled deep milling machine. The Z-axis controlled deep milling machine has the advantage that it has low tolerances. In this way, the sealing region 26 can be formed very precisely. In the present exemplary embodiment, the depth of the sealing region 26 in a direction perpendicular to the plane 16 of the substrate 12 is between 50 µm and 250 µm.

In a third step 120, the overmold tool 28 is placed onto the surface 18 of the substrate 12. In this case, the sealing edge 30 of the overmold tool 28 engages in the sealing region 26 and seals it.

In a fourth step 130, the surface 18 formed or arranged between the overmold tool 28 and the substrate 12 is overmolded with the molding compound.

Figure 5:
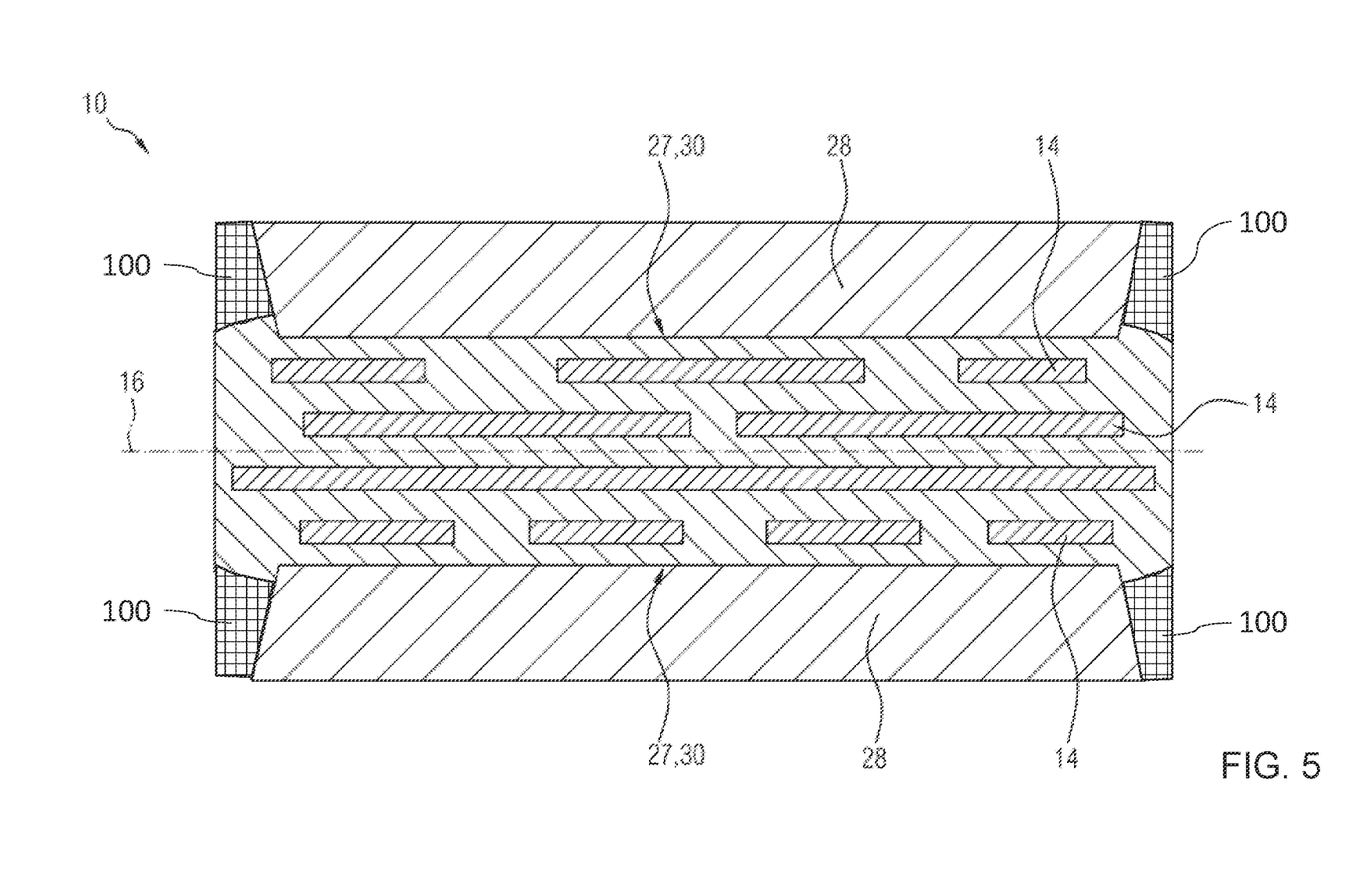
FIG. 5 shows the molding compound disposed on the surface of the electrically insulating substrate.

FIG. 5 shows a molding compound 100 disposed on the surface 18 of the electrically insulating substrate 12 and disposed adjacent to the sealing region 26. The molding compound 100 does not extend onto the sealing region 26.

LIST OF DESIGNATIONS

10 Printed circuit board
12 Substrate
14 Conductor track
16 Plane of the substrate
18 Surface
20 Upper side
22 Underside
24 Recess
26 Sealing region
27 Groove base
28 Overmold tool
30 Sealing edge

The invention claimed is:

1. A printed circuit board for an electronic component, the printed circuit board comprising:
an electrically insulating substrate having a surface;
a plurality of electrically conducting conductor tracks formed within said electrically insulating substrate;
a sealing region disposed in said surface of said electrically insulating substrate, wherein said sealing region has a depth that does not extend to a level of one of said plurality of electrically conducting conductor tracks that is located closer to said surface of said electrically insulating substrate than any other ones of said plurality of electrically conducting conductor tracks; and
a molding compound disposed on said surface of said electrically insulating substrate and disposed adjacent to said sealing region, wherein said molding compound does not extend onto said sealing region;
said sealing region formed entirely in said electrically insulating substrate, and said sealing region being at least one structure selected from the group consisting of an unfilled groove extending exclusively into said electrically insulating substrate, an unfilled channel extending exclusively into said electrically insulating substrate, and an unfilled rebate extending exclusively into said electrically insulating substrate;
wherein all of said structure, which forms said sealing region, is free from electronic components; and
the printed circuit board including at least one feature selected from the group consisting of: said sealing region being flat, and said electrically insulating substrate having a homogeneous substrate thickness in said sealing region.

2. The printed circuit board according to claim 1, wherein said sealing region is milled into said electrically insulating substrate.

3. The printed circuit board according to claim 1, wherein said sealing region has in a direction perpendicular to a plane of said electrically insulating substrate a depth of between 10 µm and 500 µm.

4. The printed circuit board according to claim 3, wherein said depth is between 25 µm and 400 µm.

5. The printed circuit board according to claim 3, wherein said depth is between 50 µm and 250 µm.

6. The printed circuit board according to claim 1, wherein said sealing region is formed as running around a periphery of said electrically insulating substrate.

7. The printed circuit board according to claim 1, wherein said surface of said electrically insulating substrate is an upper side and/or an underside, formed at a distance from said upper side, of said electrically insulating substrate.

8. The printed circuit board according to claim 1, wherein said at least plurality of electrically conducting conductor tracks and said electrically insulating substrate longitudinally extend along a common direction.

9. The printed circuit board according to claim 1, wherein said molding compound is a thermoplastic.

10. The printed circuit board according to claim 1, wherein the printed circuit board is a completed printed circuit board.

11. A method for producing a printed circuit board, which comprises the steps of:
providing a substrate having an electrically conductive conductor track disposed and formed within the substrate;
forming a sealing region on a surface of the substrate, wherein the sealing region is at least one structure selected from the group consisting of a groove extending into the substrate, a channel extending into the substrate, and a rebate extending into the substrate;
placing an overmold tool onto the surface of the substrate, a sealing edge of the overmold tool finishing with the sealing region; and
overmolding the surface disposed between the overmold tool and the substrate such that a molding compound used during the overmolding does not extend onto the sealing region.

12. The method according to claim 11, which further comprises forming the sealing region in the substrate with a Z-axis controlled deep milling machine.

13. The method according to claim 11, wherein the step of forming the sealing region on the surface of the substrate includes forming the sealing region entirely in the substrate, wherein when the sealing region is the groove, the groove extends exclusively into the substrate, wherein when the sealing region is the channel, the channel extends exclusively into the substrate, and wherein when the sealing region is the rebate, the rebate extends exclusively into the substrate.

* * * * *